United States Patent
Hellwig

(10) Patent No.: US 12,196,809 B2
(45) Date of Patent: Jan. 14, 2025

(54) ELECTRONIC INSTRUMENT FOR ANALYZING A DUT

(71) Applicant: Rohde & Schwarz GmbH & Co. KG, Munich (DE)

(72) Inventor: Mathias Hellwig, Emmering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/719,946

(22) Filed: Apr. 13, 2022

(65) Prior Publication Data

US 2023/0333164 A1 Oct. 19, 2023

(51) Int. Cl.
*G01R 31/319* (2006.01)
*G01R 31/317* (2006.01)

(52) U.S. Cl.
CPC . *G01R 31/31905* (2013.01); *G01R 31/31713* (2013.01); *G01R 31/31917* (2013.01)

(58) Field of Classification Search
CPC .... G01R 31/28; G01R 31/316; G01R 31/317; G01R 31/31712; G01R 31/31713; G01R 31/3181; G01R 31/319; G01R 31/31903; G01R 31/31905; G01R 31/31917
See application file for complete search history.

(56) References Cited

U.S. PATENT DOCUMENTS

| | | | |
|---|---|---|---|
| 4,860,227 A | 8/1989 | Tamamura | |
| 7,030,627 B1 | 4/2006 | Ashley | |
| 2005/0271164 A1* | 12/2005 | Moulthrop | H04L 27/3818 375/332 |
| 2006/0181346 A1* | 8/2006 | Nguyen | H03F 3/217 330/251 |
| 2007/0046433 A1* | 3/2007 | Mukherjee | G06K 7/0008 340/572.1 |

(Continued)

FOREIGN PATENT DOCUMENTS

DE 102013213296 A1 10/2014

OTHER PUBLICATIONS

R&S RTP High-Performance Oscilloscope User Manual, Rohde & Schwarz, Version 12, 2021, pp. 1064-1072.

*Primary Examiner* — Huy Q Phan
*Assistant Examiner* — David B Frederiksen
(74) *Attorney, Agent, or Firm* — DITTHAVONG, STEINER & MLOTKOWSKI

(57) ABSTRACT

The present disclosure relates to an electronic instrument for analyzing a device-under-test, DUT, comprising: a digital signal generator configured to generate a test signal having a first frequency; a signal output unit which is connected to the DUT, wherein the signal output unit is configured to convert the test signal to an analog signal and to forward said signal to the DUT; a signal input unit which is connected to the DUT and which is configured to receive a DUT response signal which is based on the test signal, wherein the signal input unit is configured to digitalize the DUT response signal; a signal processing circuity configured to receive the digitalized DUT response signal and to downconvert said signal using the first frequency of the test signal; and an analyzing unit configured to analyze the downconverted DUT response signal in order to determine a transfer function, an impedance and/or a loop stability of the DUT.

11 Claims, 4 Drawing Sheets

(56) References Cited

U.S. PATENT DOCUMENTS

| | | | |
|---|---|---|---|
| 2007/0073442 A1* | 3/2007 | Aghili | B25J 9/1605 |
| | | | 700/245 |
| 2007/0096759 A1* | 5/2007 | Weinraub | G01R 31/3167 |
| | | | 324/756.01 |
| 2010/0148827 A1* | 6/2010 | Olgaard | G01S 19/23 |
| | | | 327/100 |
| 2013/0003799 A1* | 1/2013 | Baney | H04B 17/11 |
| | | | 375/224 |
| 2017/0118569 A1* | 4/2017 | Quan | H04R 29/004 |
| 2018/0024204 A1* | 1/2018 | Novak | G01R 13/20 |
| | | | 324/764.01 |
| 2018/0172778 A1* | 6/2018 | Langston | H03K 5/24 |
| 2019/0219629 A1* | 7/2019 | Schnizler | G01R 31/2813 |
| 2019/0383873 A1* | 12/2019 | Hojabri | G01R 31/3171 |
| 2020/0200810 A1* | 6/2020 | Kuhn | G01R 31/31917 |
| 2020/0200821 A1* | 6/2020 | Freidhof | G01R 31/31917 |
| 2021/0102976 A1* | 4/2021 | Lindquist | G01R 13/0272 |

* cited by examiner

ELECTRONIC INSTRUMENT FOR ANALYZING A DUT

TECHNICAL FIELD

The disclosure relates to an electronic instrument for analyzing a device-under-test (DUT) and to a method for analyzing a DUT.

BACKGROUND ART

Power electronic devices can be characterized by measuring their transfer function and impedance. However, this typically requires a quite complex receiving technology which receives and evaluates high voltage or high current signals from these devices. Furthermore, such evaluations often require long recoding and processing times, especially when the DUT is operating at low frequencies, e.g. in the mHz range.

The document DE 10 2013 213 296 A1 discloses a method and device for characterizing a measurement object which emits a signal at an emission frequency. Thereby, an injection signal having an injection frequency that is adjacent to the emission frequency is injected into the device such that the injection signal and the emission signal are superimposed. The superimposed signal is then analyzed.

SUMMARY

Thus, there is a need to provide an improved device and improved method for analyzing DUTs, in particular power electronic devices.

The object of the present disclosure is achieved by the embodiments provided in the enclosed independent claims. Advantageous implementations of the present disclosure are further defined in the dependent claims.

According to a first aspect, the present disclosure relates to an electronic instrument for analyzing a device-under-test (DUT). The electronic instrument comprises a digital signal generator configured to generate a test signal having a first frequency; a signal output unit which is connected to the DUT, wherein the signal output unit is configured to convert the test signal to an analog signal and to forward said analog signal to the DUT; a signal input unit which is connected to the DUT and which is configured to receive a DUT response signal which is based on the test signal, wherein the signal input unit is configured to digitalize the DUT response signal; a signal processing circuity configured to receive the digitalized DUT response signal and to downconvert said signal using the first frequency of the test signal; and an analyzing unit configured to analyze the downconverted DUT response signal in order to determine a transfer function, an impedance and/or a loop stability of the DUT.

This achieves the advantage that the DUT can be analyzed accurately and quickly based on a generation and evaluation of digital signals. Thereby, only one instrument is required which both provides the test signal and analyses the DUT response. In particular, by digitalizing the DUT response and downconverting said response with the same frequency as the test signal, a less complex receiving and analysis technology is required.

The DUT response signal can be a DUT impulse response which is convolved or superimposed with the test signal.

The test signal is, for instance, a radio frequency (RF) signal. The test signal can be generated as a digital signal by the digital signal generator. This digital signal can then be converted to an analog signal by the signal output unit and forwarded to the DUT. The analog signal can be an analog sine signal with the first frequency. The test signal respectively the analog signal can be a voltage or a current signal. Likewise, the DUT response signal can be a voltage or a current signal.

The signal output unit can comprise an output port which is connected to the DUT. Likewise, the signal input unit can comprise an input port which is connected to the DUT.

For instance, the DUT comprises two or more ports which can be connected to the signal output respectively input units (respectively their ports). The DUT can comprise a two-port-network. The DUT can be a power electronic device. In particular, the DUT can comprise an active circuit, such as a boost converter, a buck converter or an LLC.

The transfer function of the DUT can refer to a mathematical function that models the DUT's output to the test signal. The transfer function, for instance, comprises a transfer curve of the DUT. The impedance of the DUT can refer to an input impedance and/or an output impedance of the DUT.

In particular, the analyzing unit is configured to determine the transfer function, the impedance and/or the loop stability of the DUT for the first frequency.

The analyzing unit can further be configured to determine a power supply rejection ratio (PSRR) of the DUT based on the analysis of the downconverted DUT response signal.

In particular, the signal processing circuity is configured to perform a digital downconversion of the (digitalized) DUT response signal. Thereby, the DUT response signal can be converted to a lower frequency signal, e.g., at a lower sampling rate. The signal processing circuitry can comprise a digital down converter which carries out the downconversion of the DUT response signal.

In an embodiment, the downconverted DUT response signal is a baseband signal.

For example, the baseband signal is an I/Q signal. The baseband signal can be a complex (voltage or current) signal which has a real and an imaginary part.

In an embodiment, the signal output unit comprises a digital-to-analog converter, DAC, configured to convert the test signal generated by the digital signal generator to the analog signal.

In an embodiment, the signal input unit comprises an analog-to-digital converter, ADC, which is configured to digitalize the DUT response signal and to forward said digitalized DUT response signal to the signal processing circuitry for the downconversion.

In an embodiment, the test signal is a sinusoidal signal.

In an embodiment, the signal processing circuitry comprises a mixer which is configured to downconvert the DUT response signal.

In an embodiment, the mixer is configured to downconvert the DUT response signal using the first frequency of the test signal.

The mixer can comprise or be connected to a NCO (numerically-controlled oscillator). The mixer can receive the first frequency of the test signal from the signal generator and use said first frequency for the downconversion of the DUT response signal.

In an embodiment, the electronic instrument further comprises an oscillator configured to provide the first frequency, and the mixer is connected to said oscillator to receive the first frequency.

In an embodiment, the processing circuitry comprises a spur detection unit configured to detect spurs in the DUT response signal.

For instance, in response to the spur detection unit detecting a spur in the DUT response signal, the digital signal generator unit can be configured to generate a further test signal at a different frequency and the electronic instrument can perform the analysis of the DUT with the further test signal.

In an embodiment, the digital signal generator is configured to generate a further test signal having a second frequency, and the electronic instrument is configured to repeat the analysis of the DUT with the further test signal and, thereby, to downconvert a further DUT response signal which is based on the further test signal using the second frequency.

In particular, repeating the analysis of the DUT with the further test signal comprises: converting the further test signal to a further analog signal and forwarding said further analog signal to the DUT by means of the signal output unit; receiving a further DUT response signal which is based on the further test signal with the signal input unit, wherein the signal input unit is configured to digitalize the further DUT response signal; receiving the digitalized further DUT response signal with the signal processing circuity and downconverting said signal using the second frequency of the further test signal; and analyzing the downconverted further DUT response signal with the analyzing unit in order to determine a transfer function, an impedance and/or a loop stability of the DUT. In particular, the transfer function, impedance and/or loop stability of the DUT is determined for the second frequency. Thus, by performing the analysis for a plurality of test signals with different frequencies, the analyzing unit can determine the transfer function, impedance and/or loop stability of the DUT as a function of frequency.

In an embodiment, the signal processing circuitry comprises an averaging filter configured to calculate an average of the downconverted DUT response signal and the further downconverted further DUT response signal.

In particular, the digital signal generator can be configured to subsequently generate a plurality of test signals, wherein each test signal has a different determined frequency. The electronic instrument can carry out the analysis of the DUT with each of the plurality of test signals. For instance, the electronic instrument can be configured to sweep through the test signals. In this way, the electronic instrument can determine the impedance, the transfer function and/or the loop stability of the DUT as a function of the frequency.

In an embodiment, the electronic instrument is an oscilloscope.

In an embodiment, the electronic instrument further comprises a display configured to display the downconverted DUT response signal and/or the analysis results.

According to a second aspect, the present disclosure relates to a method for analyzing a device-under-test, DUT. The method comprises the steps of: a) generating a digital test signal having a first frequency; b) converting the test signal to an analog signal and forwarding said analog signal to the DUT; c) receiving and digitalizing a DUT response signal which is based on the test signal; d) downconverting the digitalized DUT response signal using the first frequency of the test signal; and e) analyzing the downconverted DUT response signal in order to determine a transfer function, an impedance and/or a loop stability of the DUT.

In an embodiment, the method further comprises the steps of: f) generating a further digital test signal having a second frequency; and g) repeating the steps b)-e) with the further test signal having the second frequency.

In particular, repeating the steps c)-e) comprises: converting the further test signal to an analog signal and forwarding said analog signal to the DUT; receiving and digitalizing a further DUT response signal which is based on the further test signal; downconverting the digitalized further DUT response signal using the second frequency of the further test signal; and analyzing the downconverted further DUT response signal in order to further determine the transfer function, the impedance and/or the loop stability of the DUT.

The method according to the second aspect of the disclosure can be carried out by the electronic instrument according to the first aspect of the disclosure.

The above description with regard to the electronic instrument according to the first aspect of the disclosure is correspondingly valid for the method according to the second aspect of the disclosure.

BRIEF DESCRIPTION OF THE DRAWINGS

The above described aspects and implementation forms of the present disclosure will be explained in the following description of specific embodiments in relation to the enclosed drawings, in which.

DETAILED DESCRIPTIONS OF EMBODIMENTS

Figure 1:
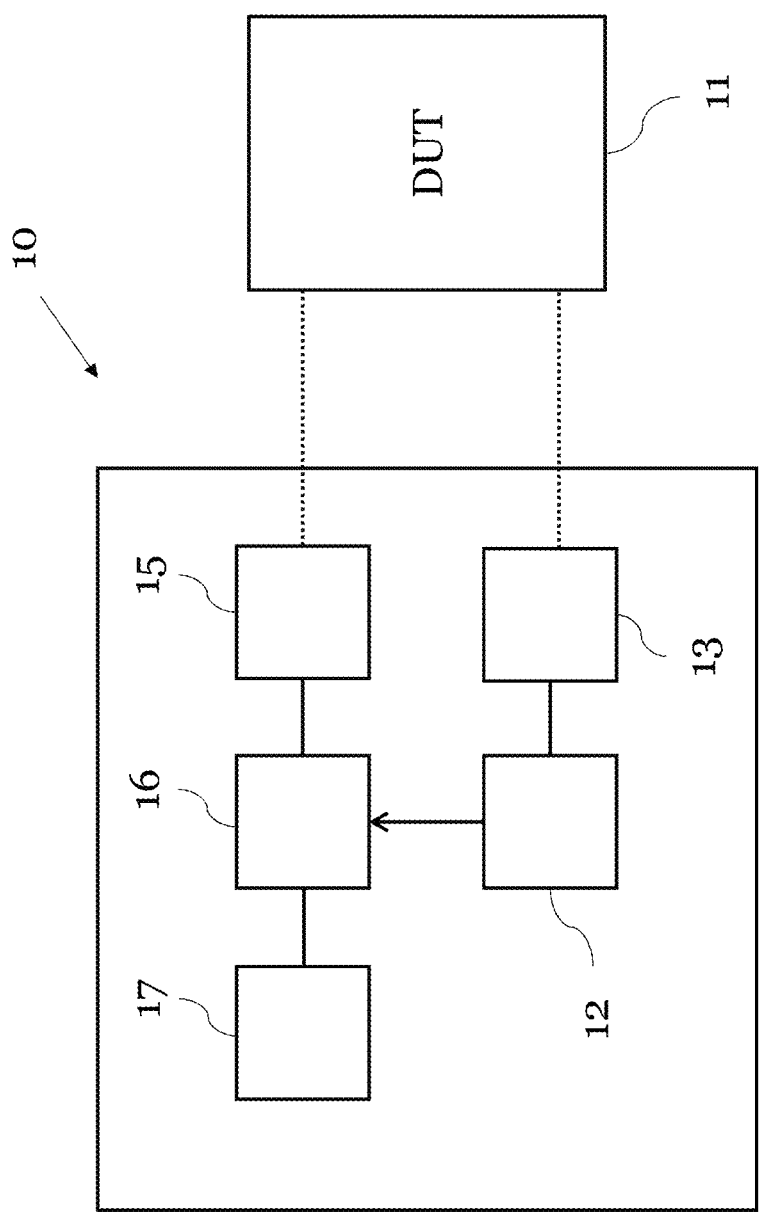
FIG. 1 shows a schematic diagram of an electronic instrument for analyzing a DUT according to an embodiment.

FIG. 1 shows a schematic diagram of an electronic instrument 10 for analyzing a DUT 11 according to an embodiment.

The electronic instrument 10 comprises: a digital signal generator 12 configured to generate a test signal having a first frequency and a signal output unit 13 which is connected to the DUT 11, and which is configured to convert the test signal to an analog signal and to forward said analog signal to the DUT 11. The electronic instrument 10 further comprises a signal input unit 15 which is connected to the DUT 11 and which is configured to receive a DUT response signal which is based on the test signal, wherein the signal input unit 15 is configured to digitalize the DUT response signal. The electronic instrument 10 further comprises a signal processing circuity 16 configured to receive the digitalized DUT response signal and to downconvert said signal using the first frequency of the test signal, and an analyzing unit 17 configured to analyze the downconverted DUT response signal in order to determine a transfer function, an impedance and/or a loop stability of the DUT 11.

The electronic instrument 10 can be an oscilloscope. The digital signal generator 12 can comprise an arbitrary waveform generator (ARB) of the oscilloscope. For instance, the ARB can be configured to generate the test signal in the form of a sinusoidal signal.

The signal processing circuity 16 and/or the analyzing unit 17 can be implemented as software and/or hardware.

The DUT 11 can be a power electronic device. In particular, the DUT 11 can comprise an active circuit, such as a boost converter, a buck converter or an LLC. The DUT 11 can further comprise two or more ports which are connected to the signal output respectively input units 13, 15 of the instrument 10. For example, the signal output unit 13 can comprise an RF connector of the ARB. The signal input unit 15 can comprise an oscilloscope channel input connector.

In an optional example (not shown), the instrument 10 can be connected to the DUT 11 via an additional communication connection. For instance, via this communication connection the instrument 10 could be connected to a clock of the DUT 11 to receive a clock signal that can be inserted via software in the signal processing circuity 16.

The DUT response signal can be a DUT impulse response to the test signal, i.e. a DUT signal that is convolved, combined or superimposed with the test signal. The DUT response signal can be generated by the DUT in response to the test signal.

The downconverted DUT response signal can be a baseband signal. The baseband signal can be an I/Q signal.

The signal output unit 13 can comprise a digital-to-analog converter (DAC) which is configured to convert the digital test signal to the analog signal that is forwarded to the DUT 11. The analog signal is, for instance, an analog sine signal at the first frequency based on the sinusoidal test signal.

The signal input unit 15 can comprises an analog-to-digital converter (ADC) which is configured to digitalize the (analog) DUT response signal that is received from the DUT and to forward said digitalized DUT response signal to the signal processing circuitry 16 for the downconversion and further analysis.

In particular, the signal processing circuitry 16 uses the frequency of the tests signal to downconvert the DUT response signal. In other words: the signal generation and the signal downconversion are performed with the same frequency, preferably synchronous and phase locked. For instance, the signal processing circuitry 16 comprises a mixer (not shown in FIG. 1) which is configured to carry out this downconversion. The signal processing circuitry 16 respectively the mixer can therefore receive the first frequency from the digital signal generator 12. For instance, the digital signal generator 12 can comprise an oscillator which is configured to generate the first frequency of the test signal For determining the transfer function, the impedance and/or the loop stability, the analyzing unit 17 can be configured to evaluate the downconverted DUT response signal with regard to amplitude and phase.

The electronic instrument 10 can carry out the above analysis with test signals at a plurality of different frequencies. For instance, the digital signal generator 12 can be configured to subsequently generate a plurality of test signals, wherein each test signal has a different determined frequency. The electronic instrument 10 can be configured to sweep through these plurality of test signals and to determine the impedance, the transfer function and/or the loop stability of the DUT 11 for each test signal.

By performing such frequency sweeps, the electronic instrument 10 can determine the impedance of the DUT as a function of frequency (U(jw)/I(jw)), with either voltage or current as parameter. For instance, an input and/or output impedance of an active circuit of the DUT 11, e.g. a boost, buck or LLC converter, can be determined as a function of frequency (U(jw)/I(jw)). The electronic instrument 10 can further determine transfer function and/or the loop stability (Uout(jw)/Uin(jw)) of such an active circuit of the DUT as a function of frequency. Furthermore, the power supply rejection ratio (PSRR) of the DUT can be analyzed in this way.

Figure 2:
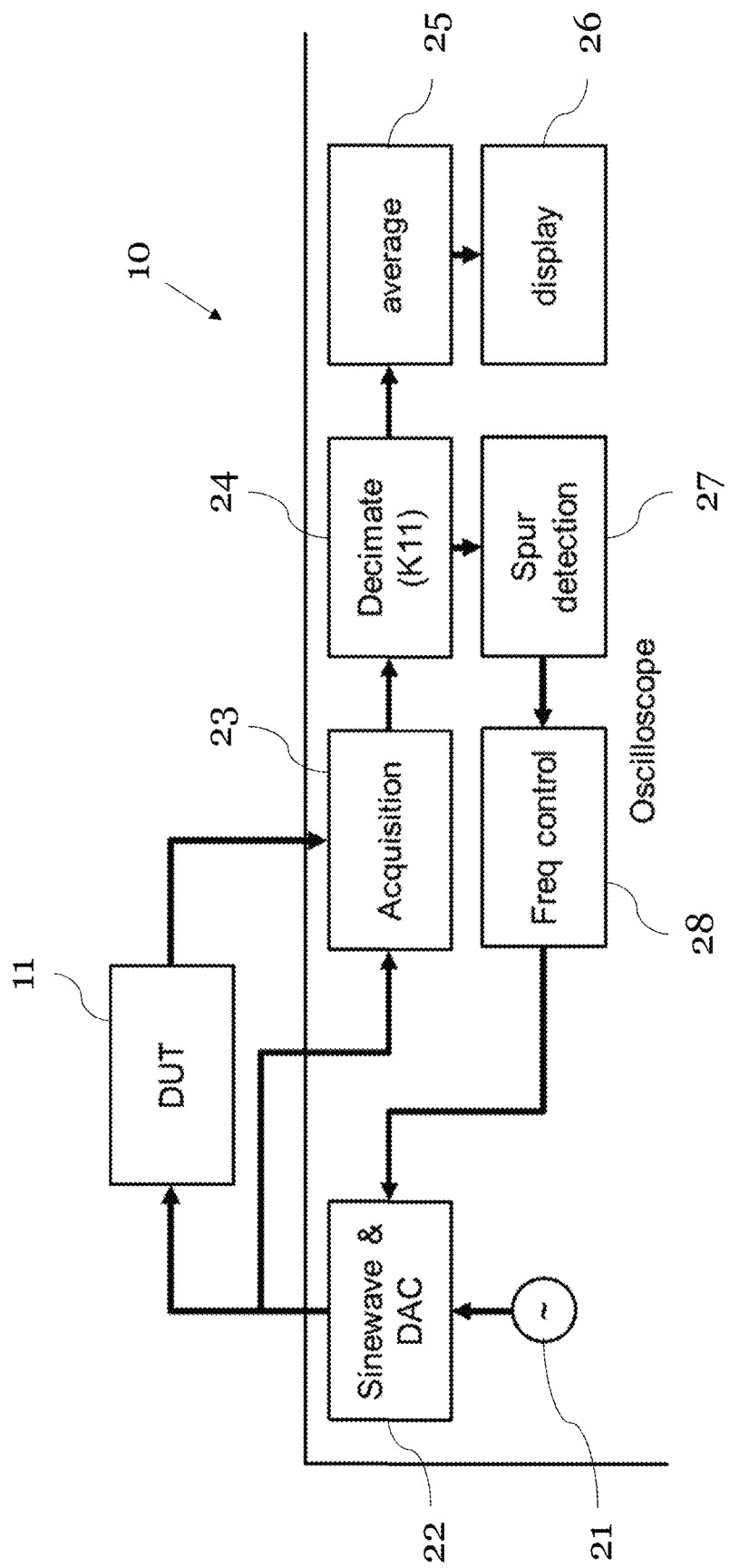
FIG. 2 shows a schematic diagram of an electronic instrument for analyzing a DUT according to an embodiment.

FIG. 2 shows a schematic diagram of the electronic instrument 10 for analyzing the DUT 11 according to an embodiment.

The electronic instrument 10 shown in FIG. 2 can be an oscilloscope which comprises a local oscillator 21 which is coupled to a signal generation unit 22. The signal generation unit 22 thereby comprises the digital signal generator 12 and the DAC of the signal output unit 13. For instance, the digital signal generator 12 can generate a sinusoidal signal (sinewave) which is converted to an analog signal and forwarded to the DUT 11.

The instrument 10 further comprises an acquisition unit 23 which receives the DUT responses signal. The acquisition unit 23 can comprise an analog-to-digital converter, a trigger unit and/or an acquisition memory. The signal input unit 15 can comprise this acquisition unit 23.

After reception by the instrument 10, the DUT response signal can be digitalized and subsequently downconverted, e.g. by means of a NCO (numerically-controlled oscillator) or NCO-based mixer which operates with the same sine function, i.e. same frequency, as the signal generation unit 22. This downconversion of the DUT response signal can at least partially be carried out by a digital processor 24 of the instrument 10. The digital processor 24 can comprise an I/Q software interface which can receive a modulated signal and output a baseband I/Q signal for further analysis. For instance, the digital processor 24 can be comprised by the signal processing circuitry 16. In this way, a differential signal can be generated which, e.g., comprises a DC component of the DUT response signal. Thereby, 1/f noise can be shifted upwards (in frequency) and can, thus, be avoided when analyzing the downconverted signal.

The instrument 10 can further comprise an averaging filter 25 which can be configured to remove residual signal components by means of averaging of the downconverted signals. Thereby, a mean value of the downconverted signals can be calculated. In this way, a high selectivity and sensitivity can be achieved. For instance, the averaging filter 25 can be at least partially implemented in software. The DUT response signal can be recorded as a broadband signal by the instrument (e.g., via frequency sweep) and digitalized. After downconversion by the NCO the signal can be narrow-band filtered by the averaging filter 25.

The instrument 10 in FIG. 2 further comprises a spur detection unit 27. The spur detection unit 27 can be comprised by the signal processing circuitry 16 or the analyzing unit 17 and can be configured to detect spurs in the DUT response signal. For instance, some DUTs, such as switching regulators, have an analog-to-digital converter that generates mixed products with the sinusoidal test signal. The spur detection unit 27 can detect and avoid such unwanted "mixtures". For instance, in case an unwanted spur or other signal characteristic is detected by the spur detection unit 27, the digital signal generator can generate a further test signal at a different frequency and the measurement can be repeated with the further test signal. For instance, the electronic instrument 10 can comprise a frequency control unit 28 which is configure to control the signal generation unit 22 to generate a further test signal at a different frequency in case a spur is detected for the first frequency.

The instrument 10 can probe for voltages of up to 2 kV rms (root-mean-square) and currents of 1 kA or more. Due to the downconversion, it can analyze the DUT response signal in a frequency range down to 1 mHz. The instrument 10 can, thus, be used for passive component characterization of power electronic DUTs with high DC bias.

The electronic instrument can further comprise a display 26, e.g. a display of the oscilloscope. The display 26 can be configured to show the downconverted DUT response signal, the analysis results and/or various settings of the instrument.

Figure 3:
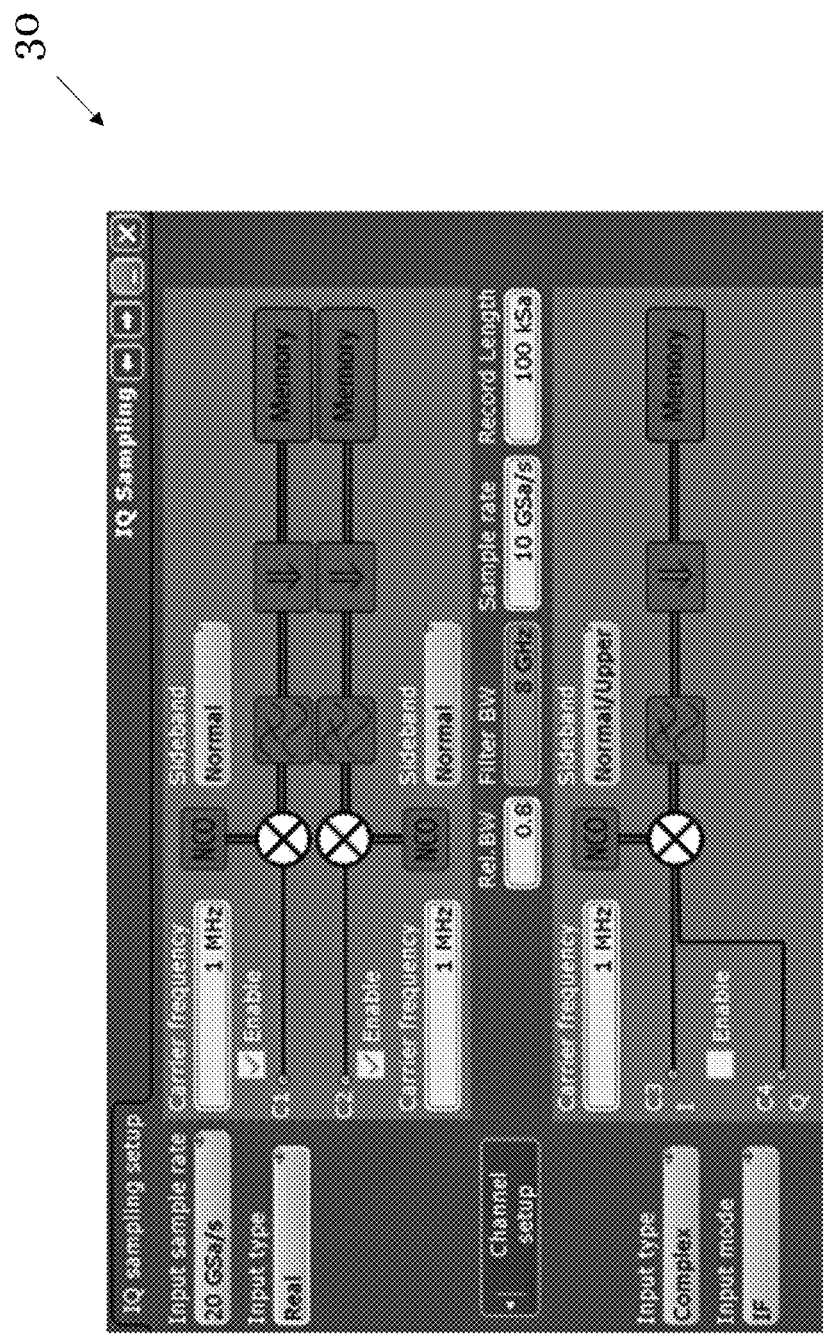
FIG. 3 shows a display view of a graphical user interface of an electronic instrument according to an embodiment.

For instance, FIG. 3 shows a graphical user interface (GUI) 30 of the electronic instrument 10 according to an embodiment. In particular, the GUI 30 in FIG. 3 shows various I/Q sampling settings at an input sample rate of 20 GHz. The GUI can be displayed in the display 26 of the instrument 10 which is, e.g., a touch display for directly receiving user input.

The electronic instrument 10 as shown in FIG. 1 or 2 can be used for analyzing a power electronic DUT 11. A possible process that can be carried out by the instrument is disclosed in the following steps: 1) normalizing the instrument 10 without the connected DUT 11 and stepping through the test frequencies (e.g., the signal input and output units 13, 15 of the instrument 10 can thereby be connected); 2) recording and storing signal characteristics, such as voltage (or current) and/or phase; 3) connecting and powering up the DUT, and applying the intended operation condition; and 4) stepping through the test frequencies and measuring on all channels voltage (or current) for each test frequency. 5) The acquired data is then (per channel) digitized and downconverted (e.g., to an I/Q signal), then filtered and decimated (e.g., in hardware). 6) The resulting waveforms (wfms) are averaged. Thereby, a mean value is generated (e.g. in SW). The result can have a real and an imaginary component, e.g.: I=Re{CH} and Q=Im{CH}. 7) As the DAC and the ADC in the acquisition block of the instrument 10 can be coupled to the same oscillator, the mean value in the post processing equals: Re{U(f)} and Im{U(f)} (for voltage). For the current it is analogous: (Re{I(f)} and Im{I(f)}). 8) During post processing, the impedance or the transfer function can be calculated over frequency and displayed as a Bode plot or Nyquist plot on the display 26 of the instrument 10. 9) A checking for spurious signals, e.g., caused by aliasing of digital hardware in the DUT 11, can further be performed and, in case spurious signals are detected, the next frequencies can be adjusted. Such spurious signals are a common issue with digital controllers.

Figure 4:
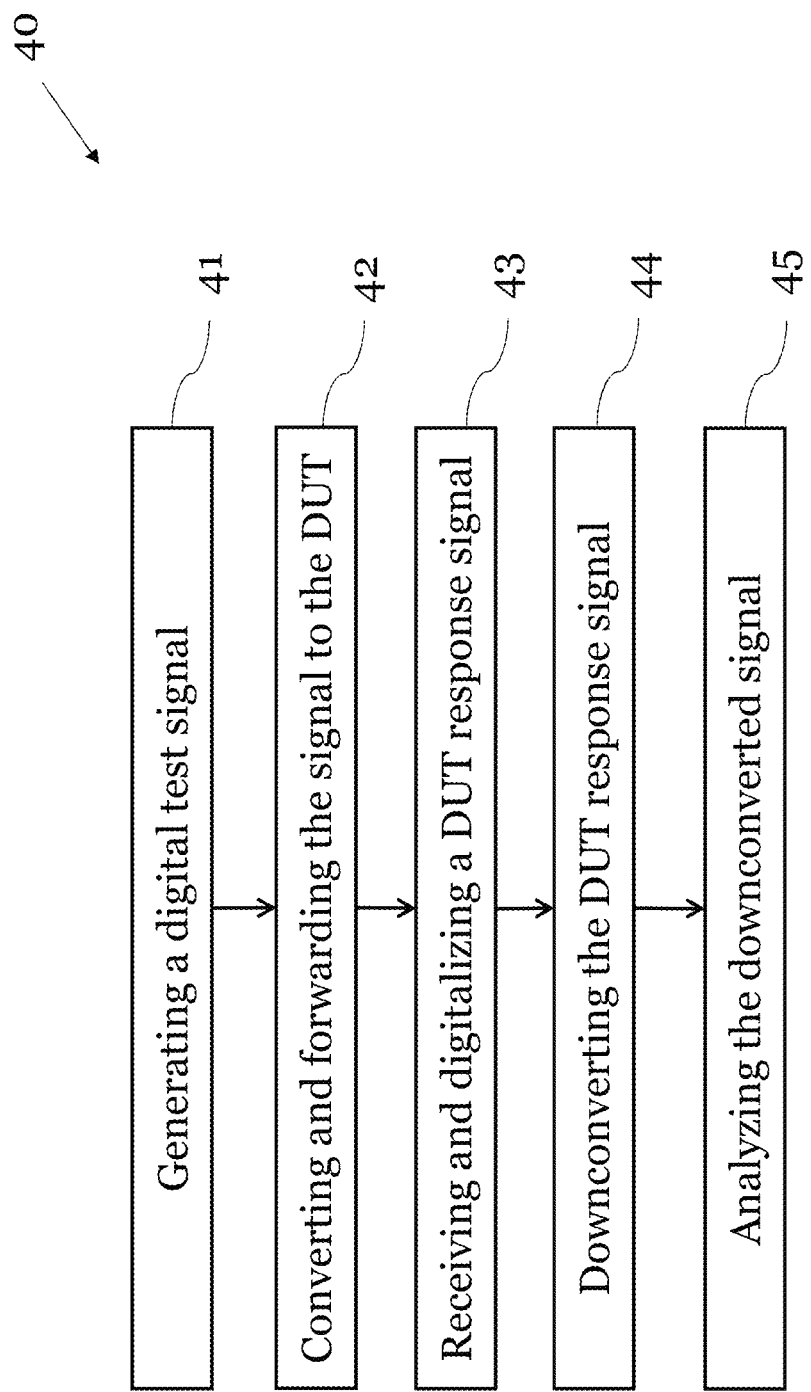
FIG. 4 shows a flow diagram of a method for analyzing a DUT according to an embodiment.

FIG. 4 shows a flow diagram of a further method 40 for analyzing the DUT 11 according to an embodiment.

The method 40 comprises the steps of: generating 41 the digital test signal having the first frequency; converting 42 the test signal to an analog signal and forwarding said signal to the DUT 11; receiving 43 and digitalizing the DUT response signal which is based on the test signal; downconverting 44 the digitalized DUT response signal using the first frequency of the test signal; and analyzing 45 the downconverted DUT response signal in order to determine a transfer function, an impedance and/or a loop stability of the DUT.

The method 40 may comprise the further steps of: generating a further digital test signal having a second frequency; and repeating the steps 42-45 for the further test signal. Thereby, the downconverted further DUT response signal based on the further test signal can be generated and analyzed.

The method 40 can be carried out with the electronic instruments 10 shown in any one of FIG. 1 or 2.

All features described above or features shown in the figures can be combined with each other in any advantageous manner within the scope of the disclosure.

The invention claimed is:

1. An electronic instrument for analyzing a device-under-test, DUT, wherein the DUT is a power electronic device, the electronic instrument comprising:
    a digital signal generator configured to generate a test signal having a first frequency;
    a signal output unit which is connected to the DUT, wherein the signal output unit is configured to convert the test signal to an analog signal and to forward said analog signal to the DUT;
    a signal input unit which is connected to the DUT and which is configured to receive a DUT response signal which is based on the test signal, wherein the signal input unit is configured to digitalize the DUT response signal;
    a signal processing circuitry configured to receive the digitalized DUT response signal and to downconvert said signal using the first frequency of the test signal, wherein the signal processing circuitry comprises a mixer which is configured to downconvert the DUT response signal, wherein the mixer comprises or is connected to a numerically-controlled oscillator, NCO;
    a software and/or hardware configured to analyze the downconverted DUT response signal in order to determine a transfer function, an impedance, and a loop stability of the DUT;
    wherein the signal processing circuitry comprises a spur detection unit configured to detect spurs in the DUT response signal,
    wherein the digital signal generator is configured to generate a further test signal having a second frequency in case a spur is detected in the DUT response signal; and
    wherein the electronic instrument is configured to repeat the analysis of the DUT with the further test signal and, thereby, to downconvert a further DUT response signal which is based on the further test signal using the second frequency.

2. The electronic instrument of claim 1,
    wherein the downconverted DUT response signal is a baseband signal.

3. The electronic instrument of claim 1,
    wherein the signal output unit comprises a digital-to-analog converter, DAC, configured to convert the test signal generated by the digital signal generator to the analog signal.

4. The electronic instrument of claim 1,
    wherein the signal input unit comprises an analog-to-digital converter, ADC, which is configured to digitalize the DUT response signal and to forward said digitalized DUT response signal to the signal processing circuitry for the downconversion.

5. The electronic instrument of claim 1,
    wherein the test signal is a sinusoidal signal.

6. The electronic instrument of claim 1,
    wherein the mixer is configured to downconvert the DUT response signal using the first frequency of the test signal.

7. The electronic instrument of claim 6,
    wherein the electronic instrument further comprises an oscillator configured to provide the first frequency; and
    wherein the mixer is connected to said oscillator to receive the first frequency.

8. The electronic instrument of claim 1,
    wherein the signal processing circuitry comprises an averaging filter configured to calculate an average of the downconverted DUT response signal and the downconverted further DUT response signal.

9. The electronic instrument of claim 1, wherein the electronic instrument is an oscilloscope.

10. The electronic instrument of claim 1, further comprising:
a display configured to display the downconverted DUT response signal and/or the analysis results.

11. A method for analyzing a device-under-test, DUT, wherein the DUT is a power electronic device, the method comprising:
a) generating a digital test signal having a first frequency;
b) converting the test signal to an analog signal and forwarding said analog signal to the DUT;
c) receiving and digitalizing a DUT response signal which is based on the test signal;
d) downconverting the digitalized DUT response signal using the first frequency of the test signal with the aid of a mixer comprising or being connected to a numerically-controlled oscillator, NCO;
e) analyzing the downconverted DUT response signal in order to determine a transfer function, an impedance, and a loop stability of the DUT;
f) generating a further digital test signal having a second frequency in case a spur is detected in the DUT response signal; and
g) repeating the steps b)-e) with the further test signal having the second frequency.

* * * * *